US008774479B2

(12) United States Patent
Madabhushi et al.

(10) Patent No.: US 8,774,479 B2
(45) Date of Patent: Jul. 8, 2014

(54) SYSTEM AND METHOD FOR AUTOMATED SEGMENTATION, CHARACTERIZATION, AND CLASSIFICATION OF POSSIBLY MALIGNANT LESIONS AND STRATIFICATION OF MALIGNANT TUMORS

(75) Inventors: Anant Madabhushi, South Plainfield, NJ (US); Shannon Agner, Ventor, NJ (US); Mark Rosen, Bala Cynwyd, PA (US)

(73) Assignees: The Trustees of the University of Pennsylvania, Philadelphia, PA (US); Rutgers, The State University of New Jersey, New Brunswick, NJ (US)

( * ) Notice: Subject to any disclaimer, the term of this patent is extended or adjusted under 35 U.S.C. 154(b) by 392 days.

(21) Appl. No.: 12/867,349

(22) PCT Filed: Feb. 19, 2009

(86) PCT No.: PCT/US2009/034505
§ 371 (c)(1),
(2), (4) Date: Oct. 19, 2010

(87) PCT Pub. No.: WO2009/105530
PCT Pub. Date: Aug. 27, 2009

(65) Prior Publication Data
US 2011/0026798 A1   Feb. 3, 2011

Related U.S. Application Data

(60) Provisional application No. 61/029,697, filed on Feb. 19, 2008.

(51) Int. Cl.
*G06K 9/00*   (2006.01)

(52) U.S. Cl.
USPC .......................................................... 382/131

(58) Field of Classification Search
None
See application file for complete search history.

(56) References Cited

U.S. PATENT DOCUMENTS

| 5,551,431 A | 9/1996 | Wells, III et al. |
| 6,317,617 B1 | 11/2001 | Gilhuijs et al. |
| 2004/0066960 A1 | 4/2004 | McLaren et al. |
| 2004/0098200 A1 | 5/2004 | Wentland et al. |
| 2005/0207630 A1 | 9/2005 | Chan et al. |

(Continued)

OTHER PUBLICATIONS

Woods, Brent J., et al. "Malignant-lesion segmentation using 4D co-occurrence texture analysis applied to dynamic contrast-enhanced magnetic resonance breast image data." Journal of Magnetic Resonance Imaging 25.3 (2007): 495-501.*

(Continued)

*Primary Examiner* — Stephen R Koziol
*Assistant Examiner* — Raphael Schwartz
(74) *Attorney, Agent, or Firm* — RatnerPrestia

(57) ABSTRACT

A method and apparatus for classifying possibly malignant lesions from sets of DCE-MRI images includes receiving a set of MRI slice images obtained at respectively different times, where each slice image includes voxels representative of at least one region of interest (ROI). The images are processed to determine the boundaries of the ROIs and the voxels within the identified boundaries in corresponding regions of the images from each time period are processed to extract kinetic texture features. The kinetic texture features are then used in a classification process which classifies the ROIs as malignant or benign. The malignant lesions are further classified to separate TN lesions from non-TN lesions.

25 Claims, 2 Drawing Sheets

(56) References Cited

U.S. PATENT DOCUMENTS

| | | | |
|---|---|---|---|
| 2006/0018548 A1* | 1/2006 | Chen et al. | 382/190 |
| 2006/0274928 A1 | 12/2006 | Collins et al. | |
| 2007/0165920 A1* | 7/2007 | Gering et al. | 382/128 |
| 2008/0031815 A1 | 2/2008 | Chen et al. | |
| 2008/0056550 A1* | 3/2008 | Kadir et al. | 382/131 |
| 2008/0122842 A1 | 5/2008 | Sirohey et al. | |
| 2010/0204563 A1 | 8/2010 | Stodilka et al. | |
| 2011/0026798 A1 | 2/2011 | Madabhushi et al. | |
| 2011/0170759 A1 | 7/2011 | Bj rnerud et al. | |
| 2011/0206257 A1 | 8/2011 | Qanadli et al. | |

OTHER PUBLICATIONS

Bryan, Bradley B., Stuart J. Schnitt, and Laura C. Collins. "Ductal carcinoma in situ with basal-like phenotype: a possible precursor to invasive basal-like breast cancer." Modern pathology 19.5 (2006): 617-621.*

Xu, Dong, et al. "Graph embedding: A general framework for dimensionality reduction." Computer Vision and Pattern Recognition, 2005. CVPR 2005. IEEE Computer Society Conference on. vol. 2. IEEE, 2005.*

Turner, Mark R. "Texture discrimination by Gabor functions." Biological Cybernetics 55.2 (1986): 71-82.*

Kapur, Tina, et al. "Segmentation of brain tissue from magnetic resonance images." Medical image analysis 1.2 (1996): 109-127.*

Kuhl, Christiane Katharina, et al. "Dynamic breast mr imaging: Are signal intensity time course data useful for differential diagnosis of enhancing lesions? 1." Radiology 211.1 (1999): 101-110.*

Xie, Xianghua, and Majid Mirmehdi. "MAC: Magnetostatic active contour model." Pattern Analysis and Machine Intelligence, IEEE Transactions on 30.4 (2008): 632-646.*

Xie, Xianghua, and Majid Mirmehdi. "Magnetostatic Field for the Active Contour Model: A Study in Convergence." BMVC. 2006.*

Xianghua et al., "Magnetostatic field for Active Contour Model: A Study in Convergence", Proceeding of the 17th British Machine Vision Conference, pp. 127-136, Sep. 2006.

International Search Report dated Apr. 29, 2009.

International Search Report and Written Opinion issued in related International Application No. PCT/US2013/077980, dated Apr. 21, 2014.

* cited by examiner

SYSTEM AND METHOD FOR AUTOMATED SEGMENTATION, CHARACTERIZATION, AND CLASSIFICATION OF POSSIBLY MALIGNANT LESIONS AND STRATIFICATION OF MALIGNANT TUMORS

The present application claims the benefit of priority of PCT International Application No. PCT/US2009/034505 filed Feb. 19, 2009 which claims the benefit from U.S. provisional application no. 61/029,697 the contents of which are incorporated herein by reference.

BACKGROUND OF THE INVENTION

Magnetic resonance imaging (MRI) of the breast is quickly becoming an important component of breast cancer screening in the United States. The American Cancer Society revised its MRI screening guidelines in 2007 to include women with a 20 to 25 percent increased lifetime risk, including family history of breast and ovarian cancers or a history of prior treatment for Hodgkin's disease. MRI has become a tool for breast cancer screening because of its advantages over mammography and ultrasound. First, breast MRI is more sensitive than x-ray mammography and ultrasound and thus may be used to detect lesions that would otherwise remain undetected. Second, MRI has been shown to be advantageous in screening women with dense breast tissue, which is common in younger patients. Third, and likely most importantly, the dynamic contrast enhanced (DCE) component of DCEMRI provides information about vascularity of a lesion that is more difficult to obtain using x-ray mammography or ultrasound.

Triple negative (TN) breast cancer has recently gained much attention in the field of breast cancer research. TN breast cancer is a molecular subtype that lacks expression of the estrogen receptor, progesterone receptor, and the HER2 receptor. Because of its lack of receptor expression, targeted therapies are ineffective, and chemotherapy is currently the only treatment available. TN breast cancer is also particularly aggressive and accounts for 12% to 26% of all breast cancers, most often occurring in young patients and African-American patients. The research community has become interested in TN breast cancer because of its particularly aggressive clinical course and lack of targeted therapies. Studies examining the pathological phenotype have revealed a heterogeneous group of breast cancers that often present as interval cancers, presenting in the months in between annual breast cancers screenings. This clearly suggests the need for greater exploration into the detection methods and biological understanding of TN breast cancers. Studies have shown that x-ray mammography is less effective in TN breast cancer screening than DCE-MRI due to the greater sensitivity of DCE-MRI in detecting TN and basal-like breast cancer phenotypes. A similar pattern of enhancement, described as rim enhancement, was observed in both subtypes. Although, qualitative radiologic descriptors have been developed for small pilot studies in TN breast cancer cases, the Inventors are unaware of any quantitative classification of the TN subtype.

SUMMARY OF THE INVENTION

The present invention is embodied in a method and apparatus for classifying possibly malignant lesions from sets of DCE-MRI images. The method includes receiving a set of MRI slice images obtained at respectively different times, where each slice image includes voxels representative of at least one lesion. The images are processed to determine the boundaries of the lesions and the voxels within the identified boundaries in corresponding regions of the images from each time period are processed to extract kinetic texture features. The kinetic texture features are used to drive a classification process wherein each lesion is identified as as malignant or benign. The malignant lesions are further classified to separate TN lesions from non-TN lesions.

DETAILED DESCRIPTION

Figure 1:
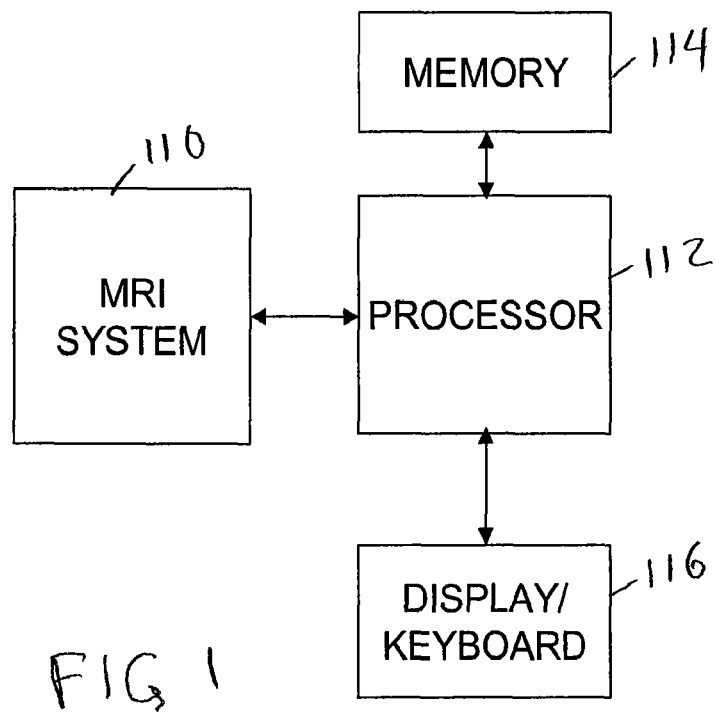
FIG. 1 is a block diagram of an exemplary DCE-MRI system suitable for use with an embodiment the subject invention.

While the embodiments of the subject invention described below concern the detection of breast tumors, it is contemplated that they may be applied generally to detecting and classifying possibly malignant lesions in other parts of the body based on DCE-MRI data. In addition, the invention may be applied to detect and classify non-malignant regions of interest (ROI) in a body.

Due to the clinical nature of TN tumors, however, accurate and consistent identification of these specific tumors is desirable, and a computer-aided diagnosis (CAD) system that could detect the TN radiologic phenotype would assist clinicians in therapeutic decision-making, monitoring therapy response, and increasing our understanding of this aggressive breast cancer subtype.

Breast DCE-MRI is performed by first injecting gadolinium diethylenetriamine-pentaacid (Gd-DTPA) into the patient's bloodstream and concurrently acquiring MRI images of the breast. Since malignant lesions tend to grow leaky blood vessels in abundance, the contrast agent is taken up by tumors preferentially and subsequently leaks out of tumors rapidly. This provides the use of DCE-MRI with an advantage over the use of other modalities to detect the tumors and contributes to the high sensitivity rates reported for breast DCE-MRI.

Both benign and malignant neoplastic tissue, however, frequently have contrast enhancement patterns that differ from normal breast tissue, and these abnormalities are highlighted in the time-dependent MRIs. As such, it may be difficult for radiologists to differentiate between benign and malignant lesions simply by observing the contrast enhanced lesion on the post-contrast MRI. For this reason, clinicians have explored various methods of observing and measuring the manner in which a lesion takes up the contrast dye. It was found, for example, that data in the temporal MRIs could be plotted as single data points on a time series curve that is reflective of the lesion type. It has been shown that malignant lesions have a characteristic curve, showing rapid uptake of contrast (steep positive initial slope) and rapid washout (subsequent negative slope). Benign lesions, on the other hand, have slow contrast uptake (small positive initial slope) and then plateau or do not reach peak intensity during the time series. This description of the DCE-MRI data is now considered convention in radiologic interpretation of breast DCE-MRI.

Despite making rapid strides in the interpretation of breast DCE-MRI in the past decade, the optimal accuracy in diagnosis using breast DCE-MRI has not been achieved, and only highly experienced radiologists are able to accurately interpret breast MRIs. Furthermore, inter-observer variability for radiologic interpretation tends to be high. Numerous studies in the field of breast MRI have shown efficacy and improved diagnosis rates using CAD, but breast MRI CAD has yet to achieve the accuracy of that seen in CAD for x-ray mammography. There is a growing need in the field to provide multi-modal data interpretation methods that will be able to consistently and accurately detect, diagnose and differentiate breast tumors in general and specifically benign and malignant tumors.

Described below is a comprehensive CAD system for the discrimination of (a) benign from malignant breast lesions, and (b) triple negative from non-triple negative breast lesions. The example embodiments concern a similar understanding of the typical lesion enhancement patterns to create an Expectation Maximization-driven Active Contour scheme to automatically extract the lesion contour. Quantitative features are then automatically obtained for each lesion.

Although features, such as morphology and texture are considered, the example embodiment uses a DCE-MRI feature called kinetic texture, which characterizes spatio-temporal changes in lesion texture. A classifier, for example, a support vector machine may be used to quantitatively classify the breast lesions in the dataset. Graph embedding or other nonlinear dimensionality reduction techniques may then be used to reduce data dimensionality and aid in visualization of the relationships between different breast lesion classes. The example CAD system employs three components: (1) Lesion detection and segmentation combining the time-series signal intensity data with an Expectation Maximization-driven Active Contour scheme; (2) Feature extraction using over 500 different features for the identification of the most discriminatory features of the tumor types; and (3) Breast lesion classification performed in a hierarchical manner, first distinguishing malignant from benign lesions and then, within the group of malignant lesions, identifying those of the aggressive triple-negative molecular phenotype.

An example system suitable for use with the subject invention is shown in FIG. 1. This system includes a magnetic resonance imaging system 110, a processor 112, a memory 114 and a display and keyboard unit 116. The processor 112 controls the MRI system 110 to capture multiple sets of images of a breast, each image being captured at a different time. The MRI images are DCE-MRI images so that at least one of the sets of images is taken at a time before the contrast agent has been taken-up by the tumor and at least two other sets of images are taken at times after the tumor has taken up the contrast agent.

In the example embodiment, the memory 114 has sufficient space to hold all of the sets of images used by the algorithm described below with reference to FIGS. 2 and 3. The display/keyboard may be used to control the algorithm, to process intermediate images, as described below and to display the results of the example method.

In the example method, described below, a total of 41 (24 malignant, 17 benign) breast DCE-MRI studies were used as the training and testing dataset. Immunohistochemistry was performed on the 24 malignant lesions to measure estrogen receptor, progesterone receptor, and HER2 receptor status. Of these, 13 were determined to be TN cases and 11 non-TN. Sagittal T1 weighted, spoiled gradient echo sequences with fat suppression consisting of one series pre-contrast Injection of Gd-DTPA and three to five series post-contrast injection were acquired (Matrix 384×384 512×512, or 896×896, slice thickness 3 cm). Temporal resolution between post-contrast acquisitions was in the range of 45-90 seconds. For each study, all of the sets of images were stored in the memory 114 by the processor 112. The data for these studies may be entered into the memory 114 through an input/output (I/O) port of the processor 112 (not shown) or through a wired or wireless network connection (not shown) to the processor 112.

In the example embodiment, the 41 studies are used in a testing mode to determine which image features are suitable for discriminating between malignant and non-malignant lesions and, within the identified malignant images to distinguish between TN and non-TN lesions. The sample studies and other sample studies may be used to determine ranges of parameter values that can be used to classify lesions as possibly malignant with known probabilities. The system shown in FIG. 1 may then be used according to the algorithm shown in FIGS. 2 and 3 to assist a healthcare professional in the analysis of a set of DCE-MRI images.

Figure 2:
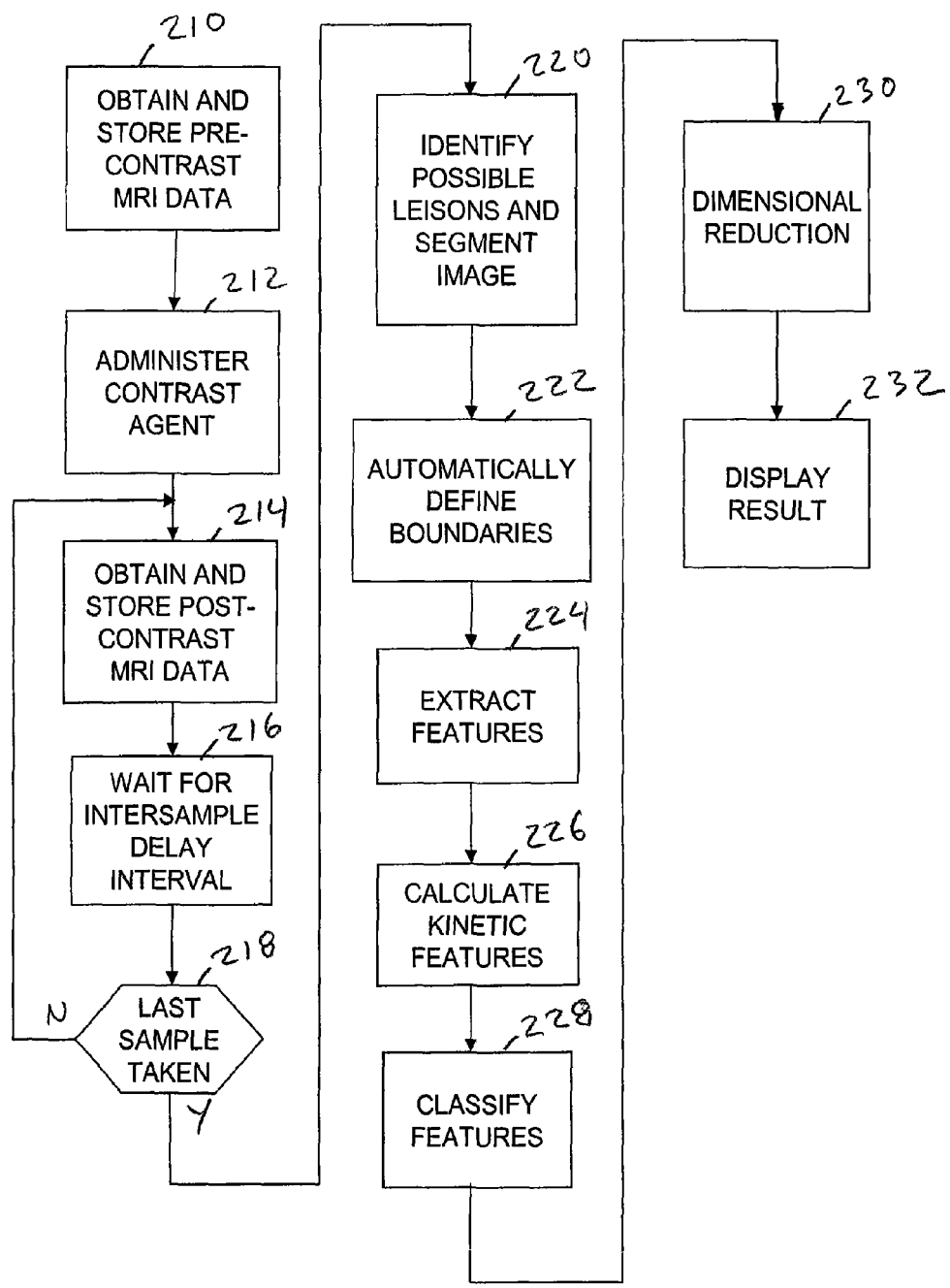
FIG. 2 is a flow-chart diagram of an example method according to an embodiment of the invention.

With reference to FIG. 2, the operation of the example embodiment in a diagnosis mode begins at step 210 when, for a particular patient, pre-contrast MRI data is obtained. Next, at step 212, the contrast agent is administered. While this step is shown as being after step 210, it is contemplated that the contrast agent may be administered before or concurrently with step 210 as long as the set of slice images in step 210 is obtained before the contrast agent is taken-up by the lesion.

Next, at step 214, the obtained data is stored in the memory 114. At step 216, the system waits for an amount of time, for example, 45 to 90 seconds. At step 218 the algorithm determines if the last set of slices has been obtained. If not, control transfers to step 214 to obtain another set of post-contrast MRI images. If, at step 218, the last set of MRI data has been obtained, control transfers to step 220.

At step 220, using the study data—or data from a particular individual when operating in the diagnosis assistance mode—for each set of images, a radiologist selects a lesion slice most representative of each lesion. This selection may be made from set of image slices taken at any time. It is contemplated, however, that the selection may be made from a time after the contrast agent has been taken-up by the lesion. In the example embodiment, the analysis described below is performed only for that slice of the lesion volume. That is to say, for the particular study, only the identified slice in the set of slices taken at each time is considered. It is contemplated, however that multiple slices may be used, with each slice being compared to corresponding slices in succeeding and/or preceding time frames.

At step 222, the selected slices are processed, according to the example method, to automatically define the contours of the lesions in the selected slice for each time period. This example process, as shown in FIG. 3 includes two steps. First, at step 310, the data is processed according to an expectation/maximization algorithm to group the voxels and second, at step 312, the grouped voxels are processed using a magnetostatic active contour model, to define the contour, or boundary, of the lesion in the image. The lesion so obtained is then visually inspected by a radiologist and if any obvious errors in segmentation are observed, these are corrected for by an attending radiologist with expertise in magnetic resonance mammography via a medical imaging software such as MRIcro, available from www.mricro.com. In the example embodiment, the medical imaging software runs on the processor and displays the result on the display of the keyboard/display unit 116. Since the technology could be applied to identifying suspicious regions in the breast that are not necessarily lesion-like, from hereon we refer to the result of segmentation as constituting a region of interest (ROI). One embodiment of the ROI is a lesion.

In step 310, the radiologist-selected slice at each time point pre- and post-contrast is compiled into a three-dimensional matrix. A signal enhancement curve is then generated for each voxel based on the signal intensity values at each time point. The coefficients of a third order polynomial are then obtained from fitting the time series curve of each individual voxel. The image scene is defined as $C=(C, f^t)$, where C is a spatial grid of voxels $c \in C$ and $f^t$ is the associated signal intensity at time $t \in \{0, 1, 2, \ldots, T-1\}$. The time-signal Intensity vector $(f^0(c), f^1(c), f^2(c), \ldots, f^{T-1}(c))$ for every voxel c in the MRI image is fitted to a third order polynomial, in a least-squares sense, which is described by equation (1).

$$f^t(c) = a_3^c t^3 + a_2^c t^2 + a_1^c t + a_0^c \qquad (1)$$

The Expectation Maximization (EM) algorithm groups the voxels based on a time-series coefficient matrix, $[a_c = (a_3^c, a_2^c, a_1^c, a_0^c), \forall c \in C]$. Based on Bayes' theorem, the EM algorithm aims to compute the posterior probability $P_{ck}$ of each voxel c belonging to $k \in \{1, 2, \ldots, K\}$, given the priori $p_{ck}$, where $p_{ck}$ is the priori probability that voxel c belongs to class k, and K is the number of Gaussian mixtures. In the example embodiment, K is 4, the dimension of the row vector $a_c$. The algorithm is run iteratively, comprising two steps: the Expectation step (E-step) and the Maximization step (M-step). The E-step calculates the posterior probability $P_{ck}$ based on the current parameters of Gaussian mixture model while the M-step recalculates or updates the model parameters, $\Sigma_k = \{\mu_k, \sigma_k, \beta_k\}$ where $\mu_k$ and $\sigma_k$ are the mean and covariance of each Gaussian component, respectively, and the $\beta_k$ values are mixture coefficients in the Gaussian mixture model. After a pre-defined number of iterations, voxel c is assigned to one of K classes, depending on which has the highest posterior probability $P_{ck}$.

Figure 3:
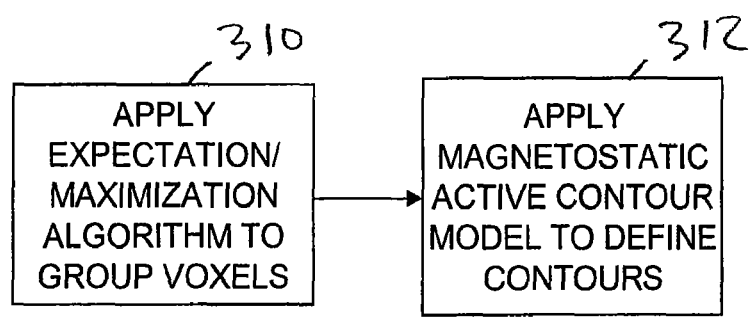
FIG. 3 is a flow-chart diagram showing details of the contour definition step of the flow-chart diagram shown in FIG. 2.

The EM results obtained in step 310 of FIG. 3 are then used to provide a specific initialization to an active contour model to obtain the final ROI segmentation. In step 312 of the example embodiment, the Magnetostatic Active Contour (MAC) model as described in an article by X. Xie and M. Mirmehdi, entitled "MAC: Magnetostatic Active Contour Model," *IEEE Transactions on Pattern Analysis and Machine Intelligence*, vol. 30, no. 4 pp. 632-646, April 2008, is employed to extract ROI boundaries. It is contemplated, however, that other active contour models may be used to define the ROI boundaries. The MAC model implements a bi-directional force field F generated from a hypothetical magnetostatic interaction between current carrying contours and object boundaries. The field F is defined over the entire image C and drives the contour towards the object boundary. The level set equation of the contour as proposed in the referenced article takes the form described in equation (2).

$$\frac{\partial \phi}{\partial n} = \alpha q(C) \nabla \cdot \left( \frac{\nabla \phi}{|\nabla \phi|} \right) |\nabla \phi| - (1-\alpha) F(C) \cdot \nabla \phi \qquad (2)$$

where $\phi$ is the level set function, $$\frac{\partial \phi}{\partial n}$$

is the time derivative of $\phi$, $\alpha$ is a real constant, $q(C) = 1/(1+|\nabla C|)$ and $\nabla(\cdot)$ represents the 2D gradient. For a given image C, K class likelihood scenes $L_k = (C, I_k)$ are constructed where $I_k(c)$ assigns each voxel $c \in C$ the probability $P_{ck}$ of belonging to a class k determined from the EM result. $L_k$ is maximized to obtain a binarized scene $L_k^B = (C, l_k^B)$ where $l_k^B(c) \in \{0,1\}$ and $l_k^B(c) = 1$ if $P_{ck}(c)$ is the highest probability assigned to c. The appropriate scene $L_k^B$ representing the ROI class is manually selected and is used to initialize the active contour. The initialization of the contour is defined as circles centered at centroids of the objects detected in $L_k^B$ via connected component labeling. The contour is then evolved until the difference between the contours of the current iteration to the next is below an empirically determined threshold.

It is desirable to have the boundaries of the ROIs well defined in order to obtain a true measure of the texture of the ROI. If, for example, the boundary of the ROI were not well defined and included voxels that were not a part of the ROI, these extra voxels would affect the texture determination. The example method described above, however, provides well-defined boundaries and tend to exclude voxels surrounding the ROI.

Referring to FIG. 2, after ROI segmentation in step 222, over 500 morphologic, textural, and kinetic features, $h_u, u \in \{1, 2, \ldots, 508\}$, are extracted in step 224. These features include gradient features and first and second order statistical features. These features may be obtained at several times, both before and after the contrast agent has been taken-up by the tumor by applying linear and spatial operations to the voxels inside the boundaries of the ROIs in the processed MRI slices. In the example that follows, time t=0 corresponds to the time at which the contrast agent has not been taken-up and all later times, ($t \in \{1, 2, \ldots, T-1\}$) correspond to times after the tumors have begun to take up the contrast agent.

Eleven non-steerable gradient features are obtained using Sobel, Kirsch and standard derivative operations. Gabor gradient operators comprising the steerable class of gradient features are also defined for every $c \in C$ where $c=(x, y)$, These features, $h_u(c)$ are described by equation (3).

$$h_u(c) = \frac{1}{\sqrt{2}\, \psi X \psi Y} e^{\frac{-1}{2}\left[\frac{x^2}{\psi X^2} + \frac{y^2}{\psi Y^2}\right]} \cos(2\pi \omega x), \qquad (3)$$

where $\omega$ is the frequency of a sinusoidal plane wave along the X-axis, and $\Psi_x$ and $\Psi_y$ are the space constraints of the Gaussian envelope along the X and Y directions respectively. Filter orientation, $\theta$, is affected by the coordinate transformations: $x'=z(x \cos \theta + y \sin \theta)$ and $y'=z(-x \sin \theta + y \cos \theta)$, where z is the scaling factor. Gabor gradient features were calculated at 6 scales $$\left( z \in \left\{ \frac{\pi}{2\sqrt{2}}, \frac{\pi}{4}, \frac{\pi}{4\sqrt{2}}, \ldots \frac{\pi}{16} \right\} \right),$$

8 orientations $$\left( \theta \in \left\{ 0, \frac{\pi}{8}, \frac{\pi}{4}, \frac{3\pi}{8}, \frac{\pi}{2}, \frac{5\pi}{8}, \frac{3\pi}{4}, \frac{7\pi}{8} \right\} \right)$$

and 4 window sizes ($s \in \{3, 5, 8, 15\}$).

Four first order statistical features (mean, median, standard deviation, and range) for 3 different window sizes are calculated for the gray values of pixels within the sliding window neighborhood $N_s, s \in \{3, 5, 8\}$.

Thirteen Haralick features are also included in the extracted features. To calculate the second order statistical (Haralick) feature scenes, a G×G co-occurrence matrix $O_{d,c,s}$ is computed, associated with $N_s(c_i)$, where G is the maximum grayscale intensity in C. The value at any location $[e_1, e_2]$ in $O_{d,c,s}$, where $e_1, e_2 \in \{1, 2, \ldots, M\}$, represents the frequency with which two distinct voxels $c_i$, $c_j \in N_s(c)$ where $i, j \in \{1, 2, \ldots, |C|\}$ with associated image intensities $f(c_1) = g_1$, $f(c_j) = g_2$ are separated by distance d. A total of 13 Haralick features including contrast energy, contrast inverse moment, contrast average, contrast variance, contrast entropy, intensity average, intensity variance, intensity entropy, entropy, energy, correlation, and 2 information measures are extracted at every voxel c∈C, based on $O_{d,c,s}$, for $s \in \{3, 5, 7\}$, $d=1$ and $G \in \{64, 128, 256\}$.

The feature set includes the extracted features described above as well as kinetic features calculated from the extracted features. The kinetic features are generated from the extracted features in step 226. Each of the kinetic features models the behavior of a voxel across all of the sample times in the set of corresponding slices. Although calculation of kinetic features is described above with respect to a ROI, it is understood that kinetic features may also be calculated for one or more non-ROI areas, by using extracted features representing the non-ROI areas. For example, kinetic features of non-ROI areas may be used to characterize and/or quantify breast parenchyma.

Kinetic signal intensity features are computed in step 226, as the coefficients $[a_3, a_2, a_1, a_0]$ of a third order polynomial obtained from fitting a curve in a least-squares sense to the signal intensity contrast enhancement curves. Hence, for each c in $C_o$, $C_1$, $C_2$, ..., $C_{T-1}$, a third order curve is fitted using equation to (4):

$$f(t) = a_3 t^3 + a_2 t^2 + a_1 t + a_0 \quad (4)$$

Where $t \in \{0, 1, 2, \ldots, T-1\}$ and c∈C. Note that f'(c) represents the signal intensity at each spatial location, c∈C, across the pre- and post-contrast MRI scenes.

To calculate the kinetic textural features, a first order statistical descriptor which could be at least one of the textural feature's mean, mode, median, variance, or standard deviation value, $p_u$, is plotted over time such that a kinetic texture curve is created, which is analogous to the one created for signal intensity. A third order polynomial is fitted to this curve to characterize its shape, defining four associated coefficients as shown in equation (5):

$$p_u(t) = r_{u,3} t^3 + r_{u,2} t^2 + r_{u,1} t + r_{u,0}. \quad (5)$$

$[r_{u,3}, r_{u,2}, r_{u,1}, r_{u,0}]$ is the feature vector, describing the kinetic texture feature, for each texture feature, u, as a function of time. The Pre-contrast Textural Features are defined as the mean texture values for each feature described above before contrast injection (t=0).

A summary of the extracted features is shown in Table 1.

TABLE 1

Extracted Features

| Feature Type | Feature | Additional Details | Window Size | Total # features |
|---|---|---|---|---|
| Morphological | Area overlap ratio | | N/A | 7 |
| | Average distance ratio | | | |
| | Standard deviation from avg dist. Ratio | | | |
| | Variance of dist. Ratio | | | |
| | Perimeter ratio | | | |
| | Compactness | | | |
| | Smoothness | | | |
| Texture | Gabor Filters | 6 scales, 8 orientations | 3, 5, 8, 15 | 48 × 4 = 192 |
| | Kirsch Filters | x-dir, y-dir, xy-diag | 3 | 3 × 3 = 9 |
| | Sobel Filters | x-dir, y-dir, xy-diag, yx-diag | 3 | 4 × 3 = 12 |
| | Grey Level | Mean | 3, 5, 8 | 8 × 3 = 24 |
| | | Median | | |
| | | Std | | |
| | | Range | | |
| | | gradient x | | |
| | | gradient y | | |
| | | magnitude of gradient | | |
| | | diagonal gradient | | |
| | Haralick | Contrast energy | 3, d = 1 | 13 |
| | | Contrast inverse moment | | |
| | | Contrast average | | |
| | | Contrast variance | | |
| | | Contrast entropy | | |
| | | Intensity average | | |
| | | Intensity variance | | |
| | | Intensity entropy | | |
| | | Entropy | | |
| | | Energy | | |
| | | Correlation | | |
| | | Information measure 1 | | |
| | | Information measure 2 | | |
| Kinetic Texture | Gabor Filters | Same as above texture | | 192 + 9 + 12 + 24 + 13 = 250 |
| | Kirsch Filters | | | |
| | Sobel Filters | | | |
| | Grey Level | | | |
| | Haralick | | | |

The features listed above are used in the testing mode of the system in which the 41 known cases are used to train and test the example system. As described below, the morphological features may not be needed when the system is operated in diagnostic assistance mode. Indeed, it is contemplated that a suitable classifier can be constructed using only the kinetic texture features.

After the kinetic features have been calculated in step 226, the next step in the process is to classify the features at step 228. In the example system, support vector machine (SVM) methods are applied to evaluate the ability of each feature class (morphology, texture, kinetic texture and kinetic signal intensity) to classify each ROI as benign or malignant. It is contemplated, however, that other classification methods may be used, such as neural networks, Hidden Markov Models and Frequent Itemset Mining. An example Support Vector Machine algorithm is described in a publication by C. Cortes and V. Vapnik entitled "Support Vector Networks," *Machine Learning*, vol 20 no. 2 Springer Netherlands 273-297 (1995). An example Hidden Markov Model system is described in a publication by S. Wong, A. B. Gardner, A. M. Krieger, B. Litt, "A Stochastic Framework for Evaluating Seizure Prediction Algorithms Using Hidden Markov Models," *J. Neurophysiology* 97(3): 2525-2532 (2007). An example Frequent Itemset Mining system is described in a publication by A. B. Gardner, A. M. Krieger, G. Vachtsevanos, B. Litt, entitled "One Class Novelty Detection for Seizure Analysis from Intracranial EEG," *J. Machine Learning Research* 7 1025-1044, (2006). Although a binary classifier is described, it is understood that the classifier may include a multi-class classifier. Accordingly, the kinetic features may be classified into at least two classes.

The example classifier contains two stages: (a) training and (b) testing. The features corresponding to each of the feature classes are used as inputs to the classifier individually and In combination. From the training data, a hyper-plane is created in the eigen-space that optimally separates the data into benign and malignant ROI classes.

Given a set of labeled training data from two distinct classes, the example SVM classifier project the data into a high dimensional space constructed by a kernel function, $\Psi$, operating on the training data. Testing data are then classified according to where they fall in relation to the hyper-plane when operated on by the same kernel function $\Psi$. The objects of each class that lie closest to this hyper-plane are the "support vectors." The general form of the SVM classifier is given by equation (6):

$$V(x) = \sum_{\tau=1}^{N_S} \xi_\tau y_\tau \Psi(x, x_\tau) + b, \qquad (6)$$

where x is the input training data, $x_\tau$, $\tau \in \{1, 2, \ldots, N_s\}$ denotes the support vectors, $y \in \{-1, 1\}$ as the training labels, $\Psi(\cdot,\cdot)$ is a positive, definite, symmetric kernel function, b is a bias obtained from the training set to maximize the distance between the support vectors, and $\xi$ is a model parameter chosen to maximize the objective function shown in equation (7):

$$\Delta(\xi) = \sum_{\tau=1}^{N_S} \xi_\tau - \frac{1}{2} \sum_{\tau,\rho=1}^{N_S} \xi_\tau \xi_\rho y_\tau y_\rho \Psi. \qquad (7)$$

The kernel function, $\Psi(\cdot,\cdot)$, defines the nature of the decision hyper-plane. The example SVM uses a common kernel called the radial basis function (RBF). The parameters p and b are found through empirical training and testing of the classifier.

After classifying the data in step 228 using the example SVM classifier, it may be desirable to reduce the dimensionality of the data in step 230 using a nonlinear dimensionality reduction technique such as graph embedding (GE) or locally linear embedding (LLE). GE is described in an article by S. Yan et al. entitled "Graph Embedding: A General Framework for Dimensionality Reduction," Proc. 2005 Internal Conference on Computer Vision and Pattern Recognition. LLE is described in a publication by L. K. Saul et al. entitled "An Introduction to Locally Linear Embedding" which is available at http://www.cs.toronto.edu/~roweis/lle/papers/lleintro.pdf.

After dimensional reduction in step 230, the last step in the process is to display the result in step 232 using the display device of the display/keyboard 116, shown in FIG. 1. The output data may be displayed as a simple result, indicating, for example, a probability that a particular ROI is malignant and/or a triple negative lesion. Alternatively, the result may be displayed in reduced dimensions as a point relative to a reduced-dimension version of the hyper-plane that defines the boundary between malignant and non-malignant or TN and non-TN lesions. This second display may be advantageous as it may provide a readily discernable distance between the data point corresponding to the ROI and the reduced-dimension hyper-plane.

The efficacy of the feature set is then evaluated based on the ability of the feature set to correctly classify each ROI, using the remaining ROIs in the dataset as the training set. Accuracy is defined as (tp+tn)/(tp+tn+fp+fn), where tp is the number of true positives, to is the number of true negatives, fp is the number of false positives, and fn is the number of false negatives.

In the example embodiment, after the system has been run to identify malignant ROIs, the data for the malignant ROIs is separated from the non-malignant ROIs and the classifier algorithm is run again on that data to separate TN lesions from non-TN malignant lesions.

Table 2 shows the ability of the example system to distinguish benign ROIs from malignant ROIs and Table 3 shows the ability of the example system to distinguish TN lesions from non-TN lesions. These tables quantify the accuracy (Acc.), sensitivity (Sens.) and specificity (Spec.) of the example method using respectively different feature sets to distinguish benign and malignant ROIs, in Table 2, and TN and non-TN lesions, in Table 3.

TABLE 2

SVM evaluation for Benign vs. Malignant ROIs

| Feature set | Acc. (%) | Sens. (%) | Spec (%) |
|---|---|---|---|
| Morphological | 73 | 88 | 53 |
| Pre-contrast Texture | 63 | 90 | 25 |
| Kinetic Signal Intensity | 63 | 67 | 59 |
| Kinetic $1^{st}$ order Textural | 83 | 79 | 88 |
| Kinetic $2^{nd}$ order Statistical | 73 | 88 | 53 |

TABLE 3

SVM evaluation for TN vs. non-TN lesions

| Feature set | Acc. (%) | Sens. (%) | Spec (%) |
|---|---|---|---|
| Morphological | 58 | 56 | 9 |
| Pre-contrast Texture | 71 | 92 | 45 |
| Kinetic Signal Intensity | 58 | 77 | 36 |
| Kinetic $1^{st}$ order Textural | 83 | 77 | 91 |
| Kinetic $2^{nd}$ order Statistical | 92 | 92 | 91 |

From these results, it is apparent that there is an advantage to using the kinetic first order textural features and kinetic second order statistical features to detect malignant ROIs and, in particular, TN lesions.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method for classifying a possibly malignant or non-malignant region of interest (ROI) from sets of dynamic contrast-enhanced (DCE) MRI images acquired over a series of time periods, the method comprising:
receiving a plurality of ROI slices, each ROI slice representing a respective one of the series of time periods, and corresponding to one of the sets of DCE MRI images, each of the ROI slices including a plurality of voxels representative of the ROI in the corresponding time period;
automatically extracting a boundary of the ROI for each received ROI slice, by processing the voxels in the received ROI slice according to an expectation/maximization algorithm to group the voxels and by processing the grouped voxels using a magnetostatic active contour model to extract the boundary of the ROI;
for each ROI slice, determining texture features of the voxels within the boundary of the ROI, to the exclusion of the voxels outside of the boundary;
determining kinetic texture features of the ROI based on the respective extracted boundary of the ROI and the texture features in each ROI slice, the kinetic texture features being representative of spatio-temporal changes in the texture features of each of the voxels in the ROI over the series of time periods; and
applying a classifier to the kinetic texture features to classify the ROI as a whole as belonging to one of at least two classes.

2. A method according to claim 1, wherein receiving the plurality of ROI slices includes receiving the plurality of ROI slices from an MRI image of a breast.

3. A method according to claim 2, wherein the ROI corresponds to breast parenchyma.

4. A method according to claim 1, wherein the ROI corresponds to a possibly malignant lesion.

5. A method according to claim 4, wherein the at least two classes includes a first class and a second class, the first class representing a benign tumor and the second class representing a malignant tumor.

6. A method according to claim 4, wherein the at least two classes includes a first class and a second class, the first class representing a triple negative malignant lesion and the second class representing a non-triple negative malignant lesion.

7. A method according to claim 1, wherein the classifier includes at least one of a support vector machine (SVM), a neural network, a hidden Markov Model process or frequent itemset mining.

8. A method according to claim 1, the method further including reducing a dimensionality of the classified result.

9. A method according to claim 1, further comprising:
determining a kinetic texture curve from the kinetic texture features; and
fitting a polynomial to the kinetic texture curve to form a kinetic texture feature vector, wherein at least one of the ROIs is classified based on the kinetic texture feature vector.

10. A non-transitory computer readable medium including computer program instructions configured to perform the steps of claim 1.

11. A method according to claim 4, wherein determining kinetic texture features includes:
extracting quantitative features of the voxels in each ROI slice based on the extracted boundary of the ROI in the ROI slice; and
determining the kinetic texture features from the extracted quantitative features to model a behavior of each voxel across the series of time periods in the corresponding ROI slices.

12. A method according to claim 11, wherein the quantitative features include at least one of a first-order statistical feature, a second-order statistical feature or a gradient feature.

13. A method according to claim 12, wherein the first-order statistical feature includes at least one of a directional gradient operator, a mean, a median, a mode or a standard deviation of the respective voxel in terms of its neighboring voxels.

14. A method according to claim 12, wherein the second-order statistical feature includes at least one of a contrast energy, a contrast inverse moment, a contrast average, a contrast variance, a contrast entropy, an intensity average, an intensity variance, an intensity entropy, an entropy, an energy, a correlation or an information measure of the respective voxel in terms of its neighboring voxels.

15. A method according to claim 12, wherein the gradient feature includes at least one of a Sobel operator, a Kirsch operator, a derivative operator or a Gabor gradient operator.

16. A system for classifying a possibly malignant or non-malignant region of interest (ROI), comprising:
a processor, having an input port configured to receive dynamic contrast enhanced (DCE) MRI images, the processor being configured to:
receive a plurality of ROI slices, each ROI slice representing a respective one of the series of time periods and corresponding to one of the sets of DCE MRI images, each of the ROI slices including a plurality of voxels representative of the possibly malignant or non-malignant ROI in the corresponding time period;
automatically extract a boundary of the ROI from each respective received ROI slice in the series of time periods, by processing the voxels in the received ROI slice according to an expectation/maximization algorithm to group the voxels and by processing the grouped voxels using a magnetostatic active contour model to extract the boundary of the ROI;
for each ROI slice, determine texture features of the voxels within the boundary of the ROI, to the exclusion of voxels outside of the boundary;
determine kinetic texture features of the ROI based on the respective extracted boundary of the ROI and the texture features in each ROI slice, the kinetic texture features being representative of spatio-temporal changes in the texture features over each of the voxels in the ROI over the series of time periods, and apply a classifier to the kinetic texture features to classify the ROI as a whole as belonging to one of at least two classes.

17. A system according to claim 16, wherein the MRI system is configured to acquire DCE MRI images of a breast.

18. A system according to claim 17, where in the ROI is breast parenchyma.

19. A system according to claim 16, wherein the ROI is a possibly malignant lesion.

20. A system according to claim 19, wherein the processor is configured to automatically extract the boundary of the ROI by:

applying an expectation/maximization (EM) algorithm to group voxels of each received ROI slice in the series of time periods according to a number of statistical classes, and apply an active contour model to each received ROI slice in the series of time periods to extract the respective boundary of the ROI for each time period, based on the respective grouped voxels.

21. A system according to claim 19, wherein the processor is configured to determine the kinetic texture features of the ROI by:

extracting quantitative features of the voxels in each ROI slice based on the extracted boundary of the ROI in the ROI slice, and determining the kinetic texture features from the extracted quantitative features to model a behavior of each voxel across the series of time periods in the corresponding ROI slices.

22. A system according to claim 19, wherein the at least two classes include a first class and a second class, the first class representing a benign tumor and the second class representing a malignant tumor.

23. A system according to claim 19, wherein the at least two classes include a first class and a second class, the first class representing a triple negative malignant lesion and the second class representing a non-triple negative malignant lesion.

24. A system according to claim 16, further comprising a display device, coupled to the processor, configured to display a classification result of the ROI.

25. A system according to claim 24, wherein the processor is configured to reduce a dimensionality of the classified result, and the display device is configured to display the classified result with the reduced dimensionality.

* * * * *